US008663874B2

(12) United States Patent
Qiu et al.

(10) Patent No.: US 8,663,874 B2
(45) Date of Patent: Mar. 4, 2014

(54) HARDCOAT COMPOSITION

(75) Inventors: Zai-Ming Qiu, Woodbury, MN (US);
John C. Hulteen, Afton, MN (US);
Douglas C. Fall, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 587 days.

(21) Appl. No.: 12/922,133

(22) PCT Filed: Mar. 11, 2009

(86) PCT No.: PCT/US2009/036733
§ 371 (c)(1),
(2), (4) Date: Sep. 10, 2010

(87) PCT Pub. No.: WO2009/114580
PCT Pub. Date: Sep. 17, 2009

(65) Prior Publication Data
US 2011/0027702 A1 Feb. 3, 2011

Related U.S. Application Data

(60) Provisional application No. 61/035,578, filed on Mar. 11, 2008.

(51) Int. Cl.
*C09D 133/08* (2006.01)
*G03F 1/12* (2006.01)

(52) U.S. Cl.
USPC ............... 430/5; 430/311; 430/537; 522/129; 522/14

(58) Field of Classification Search
None
See application file for complete search history.

(56) References Cited

U.S. PATENT DOCUMENTS

| | | | |
|---|---|---|---|
| 3,131,161 A | 4/1964 | Nitzsche | |
| 3,250,808 A | 5/1966 | Moore, Jr. | |
| 3,753,755 A | 8/1973 | Olson | |
| 3,875,045 A | 4/1975 | Bergrahm | |
| 4,000,115 A | 12/1976 | Jacobs | |
| 4,025,348 A | 5/1977 | Tsukada | |
| 4,025,407 A | 5/1977 | Chang | |
| 4,049,861 A | 9/1977 | Nozari | |
| 4,058,401 A | 11/1977 | Crivello | |
| 4,069,055 A | 1/1978 | Crivello | |
| 4,094,911 A | 6/1978 | Mitsch | |
| 4,100,134 A | 7/1978 | Robins | |
| 4,101,513 A | 7/1978 | Fox | |
| 4,130,690 A | 12/1978 | Lien | |
| 4,156,035 A | 5/1979 | Tsao | |
| 4,156,046 A | 5/1979 | Lien | |
| 4,161,478 A | 7/1979 | Crivello | |
| 4,267,302 A | 5/1981 | Ohmori | |
| 4,279,717 A | 7/1981 | Eckberg | |
| 4,293,606 A | 10/1981 | Zollinger | |
| 4,333,998 A | 6/1982 | Leszyk | |
| 4,337,107 A | 6/1982 | Eshleman | |
| 4,348,462 A | 9/1982 | Chung | |
| 4,353,980 A | 10/1982 | Helling | |
| 4,399,192 A | 8/1983 | Russell | |
| 4,426,431 A | 1/1984 | Harasta | |
| 4,504,401 A | 3/1985 | Matsuo | |
| 4,508,916 A | 4/1985 | Newell | |
| 4,623,676 A | 11/1986 | Kistner | |
| 4,647,413 A | 3/1987 | Savu | |
| 4,655,807 A * | 4/1987 | Ohmori et al. ................... 95/54 |
| 4,818,801 A | 4/1989 | Rice | |
| 4,830,910 A | 5/1989 | Larson | |
| 4,959,426 A | 9/1990 | Re | |
| 5,021,501 A | 6/1991 | Ohmori | |
| 5,073,404 A | 12/1991 | Huang | |
| 5,274,159 A | 12/1993 | Pellerite | |
| 5,340,898 A | 8/1994 | Cavezzan | |
| 5,420,179 A * | 5/1995 | Fourquier et al. ............. 523/523 |
| 5,514,728 A | 5/1996 | Lamanna | |
| 5,554,664 A | 9/1996 | Lamanna | |
| 5,576,095 A | 11/1996 | Ueda | |
| 5,723,860 A | 3/1998 | Hamada | |
| 5,980,992 A | 11/1999 | Kistner | |
| 6,187,834 B1 | 2/2001 | Thayer | |
| 6,190,743 B1 | 2/2001 | Wang | |
| 6,204,350 B1 | 3/2001 | Liu | |
| 6,344,526 B1 | 2/2002 | Noguchi | |
| 6,361,870 B1 | 3/2002 | Steffl | |
| 6,448,346 B1 | 9/2002 | Noguchi | |
| 6,646,088 B2 | 11/2003 | Fan | |
| 6,678,495 B1 | 1/2004 | Badesha | |
| 6,753,380 B2 | 6/2004 | Qiu | |

(Continued)

FOREIGN PATENT DOCUMENTS

| DE | 10004132 | 8/2001 |
|---|---|---|
| EP | 212319 | 3/1987 |

(Continued)

OTHER PUBLICATIONS

Clean Air Technology Center, EPA Technical Bulletin "Ultraviolet and Electron Beam (UVIEB) Cured Coatings, Inks and Adhesives" (Research Triangle Park, NC) EPA-456/K-01-001 Jul. 2001, 99 pages.*

Bongiovanni, "Use of Fluorinated Compounds in Cationic UV-curing," Photochemistry and UV Curing: New Trends, 2006, pp. 279-292.

Coggio, "New Durable, Soil Resistant Optical Film for Front Surface Protection of Flat-Panel Displays", Digest of Technical Papers, Society for Information Display International Symposium, 2005, vol. 36, pp. 175-177.

"Epoxide", source unknown, date unknown but believed to be prior to the date of the filing of the present application, 4 pages.

"Epoxy Resins", source unknown, date unknown but believed to be prior to the date of the filing of the present application, 4 pages.

(Continued)

*Primary Examiner* — Cynthia Hamilton
(74) *Attorney, Agent, or Firm* — Robert W. Sprague

(57) ABSTRACT

A hardcoat composition comprises (a) one or more epoxy silane compounds, (b) one or more epoxy-functionalized perfluoropolyether acrylate oligomers, and (c) photoacid generator.

24 Claims, No Drawings

(56) References Cited

U.S. PATENT DOCUMENTS

| | | | |
|---|---|---|---|
| 6,767,946 B2 | 7/2004 | Shimada | |
| 6,803,109 B2 | 10/2004 | Qiu | |
| 6,811,931 B1 | 11/2004 | Fujioka | |
| 6,887,646 B1 * | 5/2005 | Fujiwara et al. | 430/270.1 |
| 7,037,585 B2 | 5/2006 | Treadway | |
| 7,097,910 B2 | 8/2006 | Moore | |
| 7,166,329 B2 | 1/2007 | Dams | |
| 7,189,479 B2 | 3/2007 | Lu | |
| 7,335,786 B1 | 2/2008 | Iyer | |
| 7,495,118 B2 | 2/2009 | Dams | |
| 7,718,264 B2 | 5/2010 | Klun | |
| 7,728,098 B2 | 6/2010 | Dams | |
| 7,745,653 B2 | 6/2010 | Iyer | |
| 7,825,272 B2 | 11/2010 | Iyer | |
| 7,897,678 B2 | 3/2011 | Qiu | |
| 8,002,886 B2 | 8/2011 | Clark | |
| 8,015,970 B2 | 9/2011 | Klun | |
| 2003/0207963 A1 | 11/2003 | Zang | |
| 2004/0014718 A1 | 1/2004 | Pai | |
| 2004/0077775 A1 | 4/2004 | Audenaert | |
| 2004/0092675 A1 | 5/2004 | Moore | |
| 2004/0147188 A1 | 7/2004 | Johnson | |
| 2005/0037932 A1 | 2/2005 | Liu | |
| 2005/0042553 A1 | 2/2005 | Lu | |
| 2005/0054804 A1 | 3/2005 | Dams | |
| 2005/0121644 A1 | 6/2005 | Dams | |
| 2005/0164010 A1 | 7/2005 | Trombetta | |
| 2005/0196626 A1 | 9/2005 | Knox | |
| 2005/0196696 A1 | 9/2005 | King | |
| 2005/0233103 A1 | 10/2005 | Enomoto | |
| 2006/0147177 A1 | 7/2006 | Jing | |
| 2006/0148350 A1 | 7/2006 | Chang | |
| 2006/0153993 A1 | 7/2006 | Schmidt | |
| 2006/0154091 A1 | 7/2006 | Schmidt | |
| 2006/0165919 A1 | 7/2006 | Suzuki | |
| 2006/0216524 A1 | 9/2006 | Klun | |
| 2006/0228560 A1 | 10/2006 | Stewart | |
| 2007/0014927 A1 | 1/2007 | Buckanin | |
| 2007/0128557 A1 | 6/2007 | Lu | |
| 2007/0275171 A1 | 11/2007 | Dang | |
| 2007/0287093 A1 | 12/2007 | Jing | |
| 2008/0041272 A1 | 2/2008 | Tomasino | |
| 2008/0075947 A1 | 3/2008 | Padiyath | |
| 2008/0124555 A1 | 5/2008 | Klun | |
| 2009/0025608 A1 | 1/2009 | Qiu | |
| 2009/0025727 A1 | 1/2009 | Klun | |
| 2009/0148711 A1 | 6/2009 | LeBlanc | |
| 2010/0092686 A1 | 4/2010 | Laryea | |
| 2010/0160595 A1 | 6/2010 | Klun | |
| 2011/0008733 A1 | 1/2011 | Qiu | |
| 2011/0020657 A1 | 1/2011 | Chang | |
| 2011/0065045 A1 | 3/2011 | Qiu | |

FOREIGN PATENT DOCUMENTS

| | | |
|---|---|---|
| EP | 271872 | 6/1988 |
| EP | 572179 | 12/1993 |
| EP | 1083205 | 3/2001 |
| EP | 1225187 | 7/2002 |
| EP | 1225188 | 7/2002 |
| EP | 1411073 | 4/2004 |
| FR | 2886309 | 12/2006 |
| JP | 2232251 | 9/1990 |
| JP | 10176139 | 6/1998 |
| JP | 2004250517 | 9/2004 |
| JP | 2005046767 | 2/2005 |
| JP | 2006169328 | 6/2006 |
| KR | 10-2006-0080182 | 7/2006 |
| WO | WO 03/055954 | 7/2003 |
| WO | WO 03/072625 | 9/2003 |
| WO | WO 2004/024790 | 3/2004 |
| WO | WO 2004/056495 | 7/2004 |
| WO | WO 2005/014742 | 2/2005 |
| WO | WO 2005/023822 | 3/2005 |
| WO | WO 2006/030721 | 3/2006 |
| WO | WO 2006/074033 | 7/2006 |
| WO | WO-2006/074079 A1 * | 7/2006 |
| WO | WO 2008/131715 | 11/2008 |
| WO | WO 2009/035874 | 3/2009 |
| WO | WO 2009/069974 | 6/2009 |
| WO | WO 2009/083564 | 7/2009 |
| WO | WO 2009/086515 | 7/2009 |
| WO | WO 2009/114572 | 9/2009 |
| WO | WO 2009/114580 | 9/2009 |
| WO | WO 2011/011167 | 1/2011 |
| WO | WO 2011/034845 | 3/2011 |
| WO | WO 2011/034847 | 3/2011 |
| WO | WO 2011/034885 | 3/2011 |

OTHER PUBLICATIONS

"Mask Process", PKL, Choognam, Korea, [online], [retrieved from the internet on Feb. 25, 2008], www.pkl.co.kr/english/product/product05.html, 3 pages.

Physical Review E, Statistical Physics, Plasmas, Fluids, and Related Interdisciplinary Topics, vol. 59, No. 2, Part A, 5 pages, Feb. 1999.

Sangermano, "Fluorinated Alcohols as Surface-Active Agents in Cationic Photopolymerization of Epoxy Monomers", Journal of Polymer Science: Part A: Polymer Chemistry, 2006, vol. 43, pp. 4144-4150.

Sangermano, "Fluorinated Hyperbranched Polymers as Additives in Cationic Photopolymerization" Macromolecular Materials and Engineering, 2004, vol. 289, No. 8, pp. 722-727.

Sangermano, "Synthesis and Cationic Photopolymerization of a New Fluorinated Oxetane Monomer", Polymer, 2004, vol. 45, No. 7, pp. 2133-2139.

Sangermano, "Synthesis and Cationic Photopolymerization of New Fluorinated Polyfunctional Propenyl Ether Oligomers", Journal of Polymer Science, Part A: Polymer Chemistry, 2006, vol. 44, pp. 6943-6951.

Yarbrough, "Contact Angle Analysis, Surface Dynamics, and Biofouling Characteristics of Cross-Linkable, Random Perfluoropolyether-Based Graft Terpolymers", Macromolecules, 2006, vol. 39, pp. 2521-2528.

Intl Search Report for PCT/US2009/036725, 3 pages, submitted Oct. 2011.

Intl Search Report for PCT/US2009/036733, 3 pages, submitted Oct. 2011.

* cited by examiner

HARDCOAT COMPOSITION

CROSS REFERENCE TO RELATED APPLICATIONS

This application is a national stage filing under 35 U.S.C. 371 of PCT/US2009/036733, filed Mar. 11, 2009, which claims priority to Provisional Application No. 61/035,578, filed Mar. 11, 2008, the disclosure of which is incorporated by reference in its/their entirety herein.

FIELD

This invention relates to hardcoat compositions that are useful, for example, as a protective layer for a phototool.

BACKGROUND

In the printed circuit industry, photographic masks or stencils bearing a circuit pattern are known as phototools. Such a stencil, through which a photoresist can be exposed, provides an intricate complex image representing an electrical circuit. The image often consists of many fine lines and junctions spaced closely together. During its use to make printed circuit boards, the phototool is placed face down on a photoresist layer and a contact print is made by exposing the photoresist to high intensity light through the phototool. In this way, a single phototool can be used to make multiple contact prints.

After processing, a phototool must be carefully inspected through a microscope to ensure that there are no breaks in the fine lines of the image. The continued use of the phototool can cause tiny scratches and abrasions on the phototool surface. The photoresists on which the phototool is placed are usually laminated on sheet copper and small burrs or rough edges of the copper sheet can cause scratches as the phototool is transferred from one photoresist to the next. The phototool is also frequently wiped with a soft cloth to make sure it is dust and lint free. Small particles of dirt can cause scratching as they are wiped across the phototool surface. Because of this general wear and tear on the phototool surfaced during normal use, the phototool must be frequently inspected to ensure line continuity. Depending upon the size and the intricacy of the phototool, such microscopic inspections can take 2 to 3 hours.

Due to the fact that phototools are vulnerable to scratching and that abrasion is a serious problem during the normal use of a phototool, protective films and overcoats are often employed to protect the phototool. For example, polyester films coated with various kinds of pressure sensitive adhesives have been laminated to image-bearing surfaces to protect the image. Because of their thickness, however, laminating films can cause optical distortion and hence loss of resolution. Thinner protective coatings can be obtained by coating the surfaces of phototools with liquid compositions. After application, the thin liquid coating is hardened to yield the desired protective coat. Epoxy silanes and acrylate esters (for example, polyurethane acrylates) are useful in such coatings because of their resistance to abrasion. Many protective overcoats have limited release properties, however, and can therefore stick to the surface of the photoresist, particularly when relatively sticky materials such as high viscosity solder mask inks are present.

SUMMARY

In view of the foregoing, we recognize that there is a need for hardcoat compositions that can be used to protect surfaces and objects from scratching and abrasion. We also recognize that for phototool applications, it would be advantageous if protective layers comprising the hardcoat compositions release easily from relatively sticky materials such as solder mask inks.

Briefly, in one aspect, the present invention provides a hardcoat composition comprising (a) one or more epoxy silane compounds, (b) one or more epoxy-functionalized perfluoropolyether acrylate oligomers, and (c) photo-acid generator. The epoxy-functionalized perfluoropolyether acrylate oligomer has the following general structure:

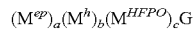

$$(M^{ep})_a(M^h)_b(M^{HFPO})_c G$$

wherein:

$M^{ep}$ is a radical from acrylate or methacrylate monomer with a curable epoxy group;

$M^{HFPO}$ is a radical from perfluoropolyether-containing acrylate or methacrylate monomer;

$M^h$ is a radical from one or more hydrocarbon acrylate monomers with or without functional groups;

G is a radical from chain transfer agent with or without functional groups;

a is at least 1; b is 0 to 20; and c is at least 1.

In another aspect, the present invention provides a hardcoat composition comprising the reaction product of components (a), (b), and (c).

The hardcoat compositions of the invention can provide abrasion-resistance, hardness, clarity, low surface energy with low adhesion, release properties, anti-reflection, resistance to staining and soiling, and repellency to stains, soils, solvents, oil, and water. Protective layers comprising the cured hardcoat compositions can be used to protect various hard substrates. They are particularly well-suited for protecting phototools from scratching and abrasion. Protective layers comprising the cured hardcoat compositions of the invention have good release properties and therefore do not stick to photoresist surfaces even when sticky materials such as high viscosity solder masks are present. Phototools with protective layers comprising the cured hardcoat compositions of the invention can advantageously be used to make multiple contact prints (for example, 5 times or more (preferably, 10 times or more; more preferably, 20 times or more)).

Cured protective layers formed from the hardcoat compositions of the invention have low surface energy with receding water contact angles greater than about 60° (preferably, greater than about 80°; more preferably, greater than about 90°) and receding hexadecane contact angles greater than about 50° (preferably, greater than about 55°; more preferably, greater than about 60°). The protective layer also exhibits good release properties/low peel force.

In yet another aspect the present invention provides novel epoxy-functionalized perfluoropolyether acrylate oligomers comprising the reaction product of (i) one or more acrylate or methacrylate monomers with a curable epoxy group and (ii) one or more perfluoropolyether-containing acrylate or methacrylate monomers; wherein the epoxy-functionalized perfluoropolyether acrylate oligomer comprises no units derived from alkyl(meth)acrylate monomers that are not reactive with epoxide groups.

DETAILED DESCRIPTION

Hardcoat Compositions

The hardcoat compositions of the invention comprise one or more epoxy silane compounds, one or more epoxy-functionalized perfluoropolyether acrylate oligomers, and photo-acid generator. The compositions may also comprise solvent.

Epoxy Silanes

The hardcoat compositions of the invention comprise curable epoxy silane compounds. Curable epoxy silanes are compounds or materials having at least one polymerizable epoxy group and at least one polymerizable silane group, the bridging of these groups being through a non-hydrolyzable aliphatic, aromatic, or aliphatic and aromatic divalent hydrocarbon linkage which may have N, O, and/or S atoms in the linkage chain. The O atoms for example would be within the chain only as ether or ester linkages. These linkage chains may be generally substituted as is well known in the art, as these substituents on the chain do not greatly affect the functional ability of the epoxy-terminated silanes to under the essential reactions necessary to polymerization through the siloxane or epoxy terminal groups. Examples of substituents which may be present on the linkage or bridging moieties are groups such as $NO_2$, $CH_3(CH_2)_nCH_2$, methoxy, ester, amide, urethane, ether and thioether, sulfone, halogen, and the like. In general structural formulae appearing within this description of the invention, such substitution of the bridging moieties is implied unless specifically excluded by language such as "unsubstituted divalent hydrocarbon radical".

The epoxy silane compounds may be monomeric, oligomeric, or polymeric. They may be, for example, acrylates, urethanes, ester-based, or the like.

The epoxy silane compounds can be of the general formula:

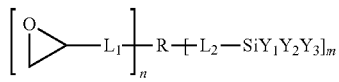

wherein:
$L_1$ is a divalent linkage;
$L_2$ is a divalent linkage;
R is multi-valent monomeric, oligomeric, or polymeric residue;
$Y_1, Y_2$ and $Y_3$ are each independently an alkyl group, aryl group or a hydrolysable group, wherein at least one of $Y_1, Y_2$ and $Y_3$ is a hydrolysable group; and
n is at least one and m is at least one.

Preferably the curable epoxy silane compounds are epoxy-terminated silane compounds having terminal polymerizable epoxy groups and terminal polymerizable silane groups, the bridging of these groups being as described above.

Useful epoxy-terminated silane compounds include epoxy-terminated alkoxy silanes of the following structure:

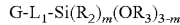

wherein:
$L_1$ is a divalent linkage,
$R_2$ and $R_3$ independently are $C_1$-$C_4$ alkyl groups,
G is a glycidoxy or epoxycyclohexyl group, and
m is 0 or 1.

Many epoxy-functional alkoxysilanes are suitable, including glycidoxymethyl-trimethoxysilane, glycidoxymethyltriethoxysilane, glycidoxymethyl-tripropoxysilane, glycidoxymethyl-tributoxysilane, β-glycidoxyethyltrimethoxysilane, β-glycidoxyethyltriethoxysilane, β-glycidoxyethyl-tripropoxysilane, β-glycidoxyethyl-tributoxysilane, β-glycidoxyethyltrimethoxysilane, α-glycidoxyethyl-triethoxysilane, α-glycidoxyethyltripropoxysilane, α-glycidoxyethyltributoxysilane, γ-glycidoxypropyl-trimethoxysilane, γ-glycidoxypropyl-triethoxysilane, γ-glycidoxypropyl-tripropoxysilane, γ-glycidoxypropyltributoxysilane, β-glycidoxypropyl-trimethoxysilane, O-glycidoxypropyl-triethoxysilane, β-glycidoxypropyl-tripropoxysilane, β-glycidoxypropyl-tributoxysilane, α-glycidoxypropyl-trimethoxysilane, α-glycidoxypropyl-triethoxysilane, α-glycidoxypropyl-tripropoxysilane, α-glycidoxypropyltributoxysilane, γ-glycidoxybutyl-trimethoxysilane, α-glycidoxybutyl-triethoxysilane, α-glycidoxybutyl-tripropoxysilane, α-glycidoxybutyl-tributoxysilane, α-glycidoxybutyl-trimethoxysilane, γ-glycidoxybutyl-triethoxysilane, γ-glycidoxybutyl-tripropoxysilane, γ-propoxybutyl-tributoxysilane, α-glycidoxybutyl-trimethoxysilane, α-glycidoxybutyl-triethoxysilane, 8-glycidoxybutyl-tripropoxysilane, α-glycidoxybutyl-trimethoxysilane, α-glycidoxybutyl-triethoxysilane, α-glycidoxybutyl-tripropoxysilane, α-glycidoxybutyl-tributoxysilane, (3,4-epoxycyclohexyl)-methyl-trimethoxysilane, (3,4-epoxycyclohexyl)methyl-triethoxysilane, (3,4-epoxycyclohexyl)methyl-tripropoxysilane, (3,4-epoxycyclohexyl)-methyl-tributoxysilane, (3,4-epoxycyclohexyl)ethyl-trimethoxysilane, (3,4-epoxycyclohexyl)ethyl-triethoxysilane, (3,4-epoxycyclohexyl)ethyl-tripropoxysilane, (3,4-epoxycyclohexyl)-ethyl-tributoxysilane, (3,4-epoxycyclohexyl)propyl-trimethoxysilane, (3,4-epoxycyclohexyl)propyl-triethoxysilane, (3,4-epoxycyclohexyl)propyl-tripropoxysilane, (3,4-epoxycyclohexyl)propyl-tributoxysilane, (3,4-epoxycyclohexyl)butyl-trimethoxysilane, (3,4-epoxycyclohexyl) butyl-triethoxysilane, (3,4-epoxycyclohexyl)-butyl-tripropoxysilane, and (3,4-epoxycyclohexyl)butyl-tributoxysilane.

Particularly preferred epoxyalkylalkoxysilanes are γ-glycidoxypropyl trimethoxy silane, γ-glycidoxypropylmethyldiethoxysilane and beta-(3,4-epoxycyclohexyl) ethyl-trimethoxysilane.

Examples of more epoxy-terminated silanes useful in the present invention are described, for example, in U.S. Pat. Nos. 4,049,861 and 4,293,606, and include compounds of the general formulae:

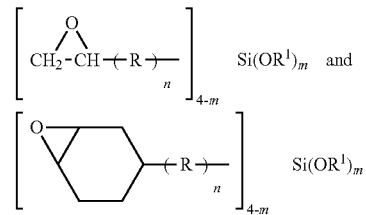

where R=a non-hydrolyzable divalent hydrocarbon radical (aliphatic, aromatic, or aliphatic and aromatic containing) of less than 20 carbon atoms or a divalent radical of less than 20 carbon atoms composed of C, H, N, S, and O atoms (these atoms are the only atoms which may appear in the backbone of the divalent radicals), the last being in the form of either linkages. No two heteroatoms may be adjacent within the backbone of the divalent hydrocarbon radical. This description defines divalent hydrocarbon radicals for epoxy terminated siloxanes in the practice of this invention. The value of n is from 0 to 1, $R^1$ is an aliphatic hydrocarbon radical of less than 10 carbon atoms, an acyl radical of less than 10 carbon atoms, or a radical of formula $(CH_2CH_2O)_k Z$ in which k is an integer of at least 1 and Z is an aliphatic hydrocarbon radical of less than 10 carbon atoms or hydrogen, m has values of 1 to 3.

The epoxy silanes used in this invention can be an epoxy silane of the above formula in which R is any divalent hydrocarbon radical such as methylene, ethylene, decalene, phenylene, cyclohexylene, cyclopentylene, methylcyclohexylene, 2-ethylbutylene, and allene or an ether radical such as —CH$_2$—CH$_2$—O—CH$_2$—CH$_2$—, (CH$_2$—CH$_2$O)$_2$—CH$_2$—CH$_2$—,

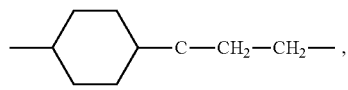

and —CH$_2$O—(CH$_2$)$_3$—, R$^1$ can be any aliphatic hydrocarbon radical of less than 10 carbon atoms such as methyl, ethyl, isopropyl, butyl, vinyl, alkyl, or any acyl radical of less than 10 carbon atoms such as formyl, acetyl, propionyl, or any radical of the formula (CH$_2$CH$_2$O)$_k$ Z in which k is an integer of at least 1, for example 2, 5, and 8, and Z is hydrogen or any aliphatic hydrocarbon radical of less than 10 carbon atoms such as methyl, ethyl, isopropyl, butyl, vinyl and allyl.

The following compounds are illustrative of some of the epoxy-terminated silanes that are useful in the present invention:

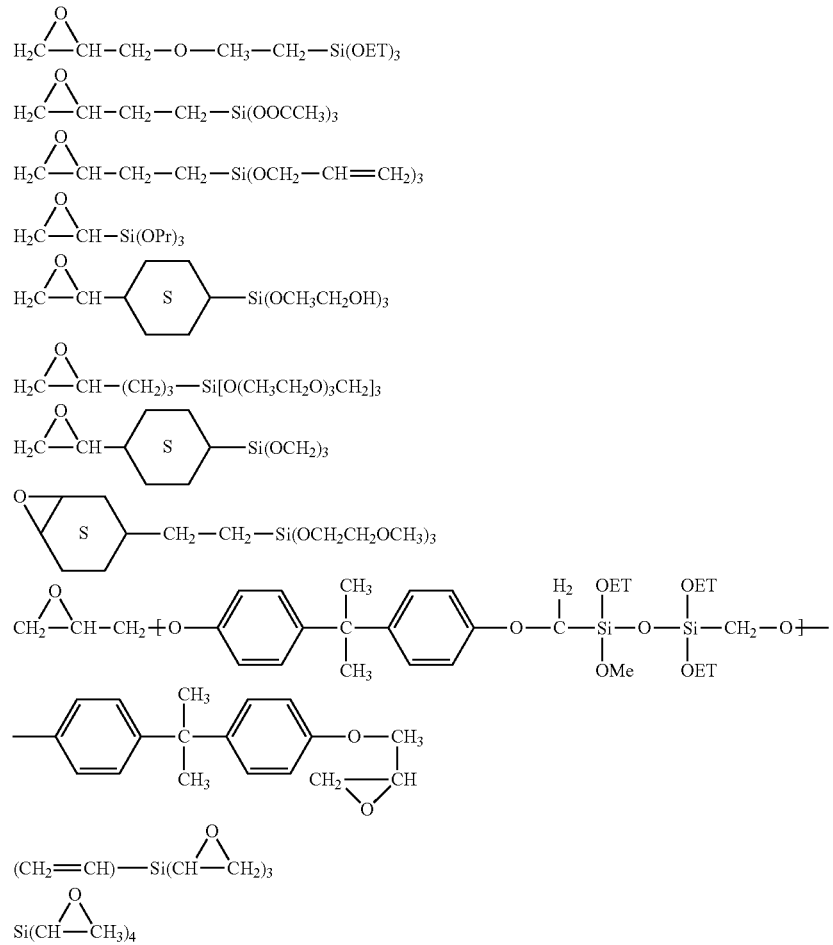

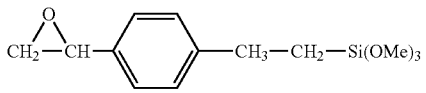
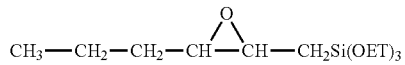
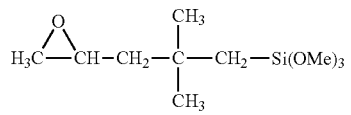
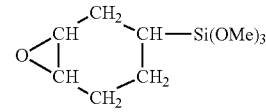
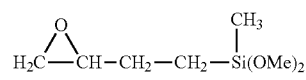

The preparation of most of the above epoxy-terminated silane compounds has been described in U.S. Pat. No. 3,131,161.

Other useful epoxy-terminated silanes are those of the formula:

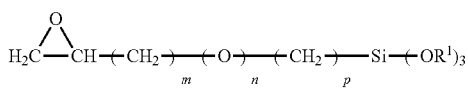

wherein
m is 1 to 6 (preferably 1 to 4),
n is 0 or 1 (preferably 1),
p is 1 to 6 (preferably 1 to 4), and
$R^1$ is H or alkyl of 1 to 10 carbon atoms (preferably alkyl of 1 to 4 carbon atoms).

In addition to any of the above epoxy silanes, partially hydrolyzed or condensated epoxy silane, which are further curable under photo-irradiation in the presence of photo-acid generator are useful in the present invention, alone or blended with non-hydrolyzed epoxy silane. These partial hydrolyzates can be formed by the partial hydrolysis of the silane $OR^1$ groups. Thus the term precondensate includes siloxanes in which some or all of the silicon atoms are bonded through oxygen atoms. Prepolymers are formed by the polymerization of groups other than the silanes as in U.S. Pat. Nos. 4,100,134 and 7,037,585.

Epoxy silanes typically comprise at least about 90% by weight of the hardcoat composition. Preferably, they comprise from about 90% by weight to about 98% by weight of the composition.

Epoxy-Functionalized Perfluoropolyether Acrylate Oligomers

The hardcoat compositions of the invention also comprise an epoxy-functionalized perfluoropolyether acrylate oligomer. The epoxy silanes described above and the epoxy-functionalized perfluoropolyether acrylate oligomer crosslink with themselves and with each other in the presence of acid generated, for example, by cationic photoinitiator, giving the composition durability. In addition, the fluorochemical imparts release properties.

Useful epoxy-functionalized perfluoropolyether acrylate oligomers have the following general structure:

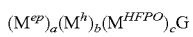

wherein:
$M^{ep}$ is a radical from acrylate or methacrylate monomer with a curable epoxy group; $M^{HFPO}$ is the radical from perfluoropolyether-containing acrylate or methacrylate monomer; specifically, the perfluoropolyether is made from the oligomerization of hexafluoropropylene oxide (HFPO), (HFPO)x-L-OC(O)CH=$CH_2$ or (HFPO)x-L -OC(O)$CCH_3$=$CH_2$ wherein L is a divalent linking group (for example, C(O)NH$CH_2CH_2$—, —$CH_2CH_2OCH_2CH_2$—, or —$CH_2OCH_2CH_2OCH_2CH_2$—) and x is 3 or greater (preferably, 5 or greater);
$M^h$ is a radical from one or more hydrocarbon acrylate monomers with or without functional groups;
G is a radical from chain transfer agent with or without functional groups; a is at least 1; b is 0 to 20; and c is at least 1.

Preferably, the perfluoropolyether is made from the oligomerization of hexyluoropropene oxide (HFPO), $(HFPO)_x$LOC(O)CH=$CH_2$ or $(HFPO)_x$LOC(O)CMe=$CH_2$.

For good solubility in non-fluorinated organic solvent and compatibility with epoxy-silanes, a or a+b is preferred having 50% or more by weight. For better water/oil repellency and release performance, c is preferred having 10% or more by weight.

Useful ethylenic epoxide compounds include epoxy-acrylates such as glycidyl methacrylate, glycidyl acrylate, 2-oxiranylmethoxy-ethyl acrylate, 2-oxiranylmethoxy-ethyl methacrylate, and aposcopolamine

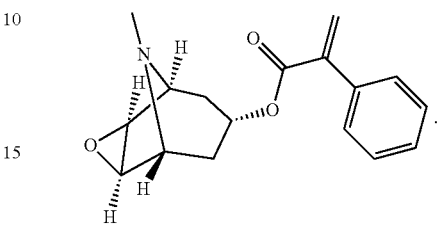

Preferred ethylenic epoxides are glycidyl methacrylate and glycidyl acrylate.

Acrylate or methacrylate from the following epoxy-alcohols are also useful:
2-methyl-2,3-epoxy-1-propanol

Glycerol digylycidyl ether

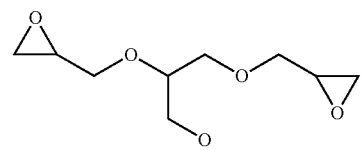 [SMILES: OCC(COCC1CO1)OCC1CO1]

1,3-digylcidyl glyceryl ether

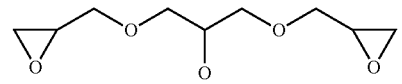 [SMILES: OC(COCC1CO1)COCC1CO1]

Trimethylolpropane-diglycidyl ether

(3-hex-5-enyl-oxiranyl)-methanol

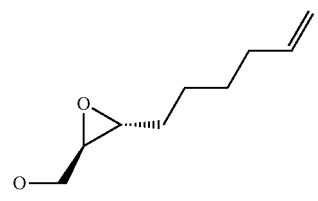

1-(3-tert-butyl-oxiranyl)-propan-1-ol

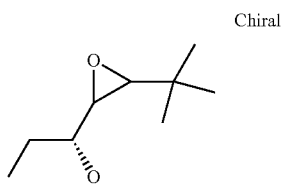

(3-tert-butyl-oxiranyl)-cyclolhexyl-methanol

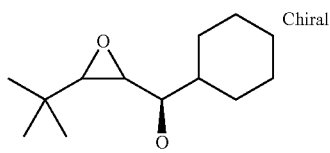

3-[2-tert-butyl-dimethyl-silanyloxy)-ethyl]-oxiranyl-methanol

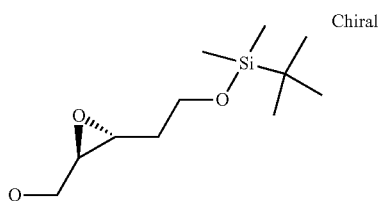

2-[1-oxiran-2-ylmethyl)piperidin-2-yl]ethanol

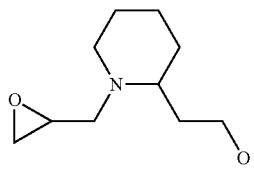 [SMILES: OCCC1CCCCN1CC1CO1]

3-phenylglycidol

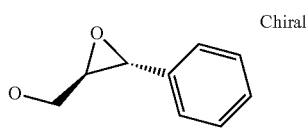 [SMILES: OC[C@H]1O[C@@H]1c1ccccc1]

Other useful ethylenic epoxides include allyl glycidyl ether, butadiene monoxide, 1,2-epoxy-7-octene, 1,2-epoxy-5-hexene, 4-vinyl-1-cyclohexene 1,2-epoxide, allyl-11,12-epoxy stearate, 1,2-epoxy-9-decene, limonene oxide, isoprene monoxide, and 1-ethynyl-3-(oxiran-2-ylmethoxy)-benzene

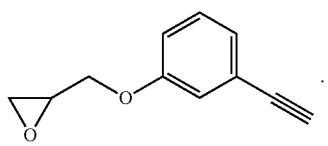

In some embodiments, G corresponds to the Formula:

—SQ$^1$T$^2$C(O)NHQ$^5$Si(Y$^1$)(Y$^2$)(Y$^3$)— wherein
Q$^1$ and Q$^5$ each independently represent an organic divalent linking group,
T$^2$ represents O or NR with R being hydrogen, an aryl or a C$_1$-C$_4$ alkyl group, and
Y$^1$, Y$^2$ and Y$^3$ each independently represent an alkyl group, an aryl group or a hydrolysable group with at least one of Y$^1$, Y$^2$ and Y$^3$ representing a hydrolysable group.

M$^{HFPO}$ is the residue of acrylate monomer with perfluoropolyether segment with the following general structure:

R$_f$QX—C(O)CR=CH$_2$
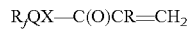

wherein
R$_f$ is a monovalent perfluoropolyether moiety as identified above; More specifically, Rf is the oligomer of hexafluoropropene oxide with molecular weight at least 1,000;
Q is independently a connecting group of valence at least 2, which may contain heteroatoms such as —O—, —S— and —NR$_3$—, and the like;
X is O, S, or NR, wherein R is H or a lower alkyl of 1 to 4 carbon atoms; Suitable fluorochemical monofunctional acrylate compounds include those that comprise at least one perfluoropolyether ("R$_f$") group. The perfluoropolyether group R$_f$ can be linear, branched, cyclic, or combinations thereof and can be saturated or unsaturated. The perfluoropolyether has at least two catenated oxygen heteroatoms. Exemplary perfluoropolyethers include, but are not limited to, those that have perfluorinated repeating units selected from the group of —(C$_p$F$_{2p}$)—, —(C$_p$F$_{2p}$O)—, —(CF(Z))—, —(CF(Z)O)—, —(CF(Z)C$_p$F$_{2p}$O)—, —(C$_p$F$_{2p}$CF(Z)O)—, —(CF$_2$CF(Z)O)—, or combinations thereof. In these repeating units, p is typically an integer of 1 to 10. In some embodiments, p is an integer of 1 to 8, 1 to 6, 1 to 4, or 1 to 3. The group Z is a perfluoroalkyl group, perfluoroether group, perfluoropolyether, or a perfluoroalkoxy group, all of which can be linear, branched, or cyclic. The Z group typically has no more than 12 carbon atoms, no more than 10 carbon atoms, or no more than 9 carbon atoms, no more than 4 carbon atoms, no more than 3 carbon atoms, no more than 2 carbon atoms, or no more than 1 carbon atom. In some embodiments, the Z group can have no more than 4, no more than 3, no more than 2, no more than 1, or no oxygen atoms. In these perfluoropolyether structures, the different repeat units can be distributed randomly along the chain.

R$_f$ can be monovalent or divalent. In some compounds where R$_f$ is monovalent, the terminal groups can be (C$_p$F$_{2p+1}$)—, (C$_p$F$_{2p+1}$O)—, (X'C$_p$F$_{2p}$O)—, or (X'C$_p$F$_{2p+1}$)— where X' is hydrogen, chlorine, or bromine and p is an integer of 1 to 10. In some embodiments of monovalent R$_f$ groups, the terminal group is perfluorinated and p is an integer of 1 to 10, 1 to 8, 1 to 6, 1 to 4, or 1 to 3. Exemplary monovalent R$_f$ groups include CF$_3$O(C$_2$F$_4$O) CF$_2$—, and C$_3$F$_7$O(CF(CF$_3$)CF$_2$O)—CF(CF$_3$)— wherein n has an average value of 0 to 50, 1 to 50, 3 to 30, 3 to 15, or 3 to 10.

Suitable structures for divalent R$_f$ groups include, but are not limited to, —CF$_2$O(CF$_2$O)$_q$(C$_2$F$_4$O)—CF$_2$—, —(CF$_2$)$_3$O(C$_4$F$_8$O)$_n$(CF$_2$)$_3$—, —CF$_2$O(C$_2$F$_4$O)$_n$CF$_2$—, and CF(CF$_3$)(OCF$_2$CF(CF$_3$))$_s$OC$_t$F$_{2t}$O(CF(CF$_3$)CF$_2$O)—CF(CF$_3$)—,
wherein q has an average value of 0 to 50, 1 to 50, 3 to 30, 3 to 15, or 3 to 10; n has an average value of 0 to 50, 3 to 30, 3 to 15, or 3 to 10; s has an average value of 0 to 50, 1 to 50, 3 to 30, 3 to 15, or 3 to 10; the sum (n+s) has an average value of 0 to 50 or 4 to 40; the sum (q+n) is greater than 0; and t is an integer of 2 to 6.

As synthesized, compounds typically include a mixture of $R_f$ groups. The average structure is the structure averaged over the mixture components. The values of q, n, and s in these average structures can vary, as long as the compound has a number average molecular weight of at least about 400. Useful compounds often have a molecular weight (number average) of 400 to 5000, 800 to 4000, or 1000 to 5000.

Examples of suitable fluorochemical monomers for $M^{HFPO}$ include $C_3F_7O(CF(CF_3)CF_2O)_uCF(CF_3)CH_2OC(O)CH=CH_2$, $C_3F_7O(CF(CF_3)CF_2O)_uCF(CF_3)CH_2OC(O)C(CH_3)=CH_2$, $C_3F_7O(CF(CF_3)CF_2O)_uCF(CF_3)CH_2OCH_2CH_2C(O)CH=CH_2$, $C_3F_7O(CF(CF_3)CF_2O)_uCF(CF_3)CH_2OCH_2CH_2OC(O)C(CH_3)=CH_2$, $C_3F_7O(CF(CF_3)CF_2O)_uCF(CF_3)C(O)NHCH_2CH_2OC(O)CH=CH_2$, $C_3F_7O(CF(CF_3)CF_2O)_uCF(CF_3)C(O)NHCH_2CH_2OC(O)(CH_3)=CH_2$, $CH_2=CHC(O)OCH_2CF_2(OCF_2)_u(OCF_2CF_2)_vOCF_2CH_2OC(O)CH=CH_2$, and $CH_2=C(CH_3)C(O)OCH_2CF_2(OCF_2)_u(OCF_2CF_2)_vOCF_2CH_2OC(O)(CH_3)=CH_2$, wherein u and v are independently 1 to 50.

$M^h$ is the radical polymerizable ethylenic monomers excluding epoxide-reactive functional substitutes. The preferred ethylenic monomer is acrylates and methacrylate, including, for example, methyl acrylate, methyl methacrylate, ethyl acrylate, ethyl methacrylate, butyl acrylate, butyl methacrylate, octyl acrylate, octyl methacrylate, methoxyethyl acrylate, methoxyethyl methacrylate, methoxypropyl acrylate, octadecyl acrylate, octadecyl methacrylate and $CH_2=CMeC(O)O(CH_2)_3Si(OMe)_3$.

Preferably, $M^h$ is a radical from methyl acrylate, methyl methacrylate, ethyl acrylate, ethyl methacrylate, butyl acrylate, butyl methacrylate, octyl acrylate, octyl methacrylate, octadecyl acrylate, or octadecyl methacrylate.

The oligomer can be prepared through a free radical polymerization of a fluorinated monomer, optionally with a non-fluorinated monomer and a monomer that includes the epoxy group, in the presence of a chain transfer agent. A free radical initiator can be used to initiate the polymerization or oligomerization reaction. Suitable free-radical initiators include, for example, azo compounds, such as azobisisobutyronitrile (AIBN) and azo-2-cyanovaleric acid, hydroperoxides (for example, cumene, t-butyl and t-amyl hydroperoxide, dialkyl peroxides such as di-t-butyl and dicumylperoxide), peroxyesters such as t-butylperbenzoate and di-t-butylperoxy phthalate, diacylperoxides such as benzoyl peroxide and lauroyl peroxide.

The oligomerization reaction can be carried out in any solvent suitable for organic free-radical reactions. The reactants can be present in the solvent at any suitable concentration including, for example, from about 5% by weight to about 90% by weight based on the total weight of the reaction mixture. Suitable solvents include, for example, aliphatic and alicyclic hydrocarbons (for example, hexane, heptane, cyclohexane), aromatic solvents (for example, benzene, toluene, xylene), ethers (for example, diethylether, glyme, diglyme, diisopropyl ether), esters (for example, ethyl acetate, butyl acetate), alcohols (for example, ethanol, isopropyl alcohol), ketones (for example, acetone, methylethyl ketone, methyl isobutyl ketone), sulfoxides (for example, dimethyl sulfoxide), amides (for example, N,N-dimethylformamide, N,N-dimethylacetamide), halogenated solvents such as methylchloroform, FREON 113, trichloroethylene, alpha,alpha,alpha-trifluorotoluene, and mixtures thereof.

The oligomerization reaction can be carried out at any temperature suitable for conducting an organic free-radical reaction. Particular temperature and solvents for use can be easily selected based on considerations such as the solubility of reagents, the temperature required for the use of a particular initiator, and desired molecular weight. While it is not practical to enumerate a particular temperature suitable for all initiators and all solvents, generally suitable temperatures are from about 30° C. and about 200° C. The fluorochemical oligomer is prepared in the presence of chain transfer agent.

Suitable chain transfer agents include, for example, a hydroxy-, amino-, mercapto and halogen groups. The chain transfer agent can include at least two of such hydroxy, amino-, mercapto and halogen groups. Illustrative examples of chain transfer agents useful in the preparation of the fluorochemical oligomer include tetrabromomethane, 2-mercaptoethane, 3-mercaptobutane, 3-mercapto-2-butanol, 3-mercapto-2-propanol, 3-mercapto-1-propanol, 3-mercapto-1,2-propanediol, 2-mercapto-ethylamine, di(2-mercaptoethyl) sulfide, octylmercaptan, and dodecylmercaptan.

In one useful embodiment, a chain transfer agent that includes a silyl group having at least one hydrolyzable groups is used in the oligomerization to produce the fluorochemical oligomer. Useful chain transfer agent that include such a silyl group include chain transfer agents of Formula:

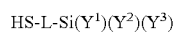

$HS-L-Si(Y^1)(Y^2)(Y^3)$ wherein
L represents a divalent linking group, and
$Y^1$, $Y^2$ and $Y^3$ each independently represents an alkyl group, preferably a
$C_1-C_8$ alkyl group such as methyl, ethyl and propyl, an alkyl group containing a cycloalkyl such as cyclohexyl and cyclopentyl, an aryl group such as phenyl, an alkylaryl group, an aralkyl group, and a hydrolysable group such as a halogen or an alkoxy group such as methoxy, ethoxy or an aryloxy group, where at least one of $Y^1$, $Y^2$ and $Y^3$ represents a hydrolysable group.

A single chain transfer agent or a mixture of different chain transfer agents can be used. Useful chain transfer agents are $CBr_4$, 2-mercaptoethane, octylmercaptane and 3-mercaptopropyltrimethoxysilane. A chain transfer agent is preferably present in an amount sufficient to control the number of polymerized monomer units in the oligomer and to obtain the desired molecular weight of the oligomeric fluorochemical silane. The chain transfer agent is generally used in an amount of about 0.05 equivalents to about 0.5 equivalents, preferably about 0.25 equivalents, per equivalent of monomer including fluorinated and non-fluorinated monomers. One example of a useful commercially available chain transfer agent is $CBr_4$ available from Sigma-Aldrich Chemical Company (Milwaukee, Wis.). Other examples of useful commercially available chain transfer agents are $HS(CH_2)_3Si(OCH_3)_3$ and $C_{12}H_{25}SH$ available from Sigma-Aldrich Chemical Company (Milwaukee, Wis.).

One of preferred-functionalized perfluoropolyether acrylate oligomers has the general Formula:

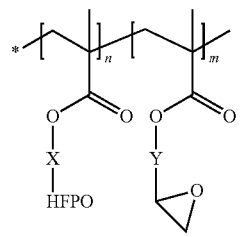

wherein
HFPO is perfluoropolyether made from the oligomerization of hexafluoropropene oxide having an average molecular weight of 1,000 or higher;
X and Y are independently divalent linkage groups;

n is at least 1, and m is at least 1.

The epoxy-functionalized perfluoropolyether acrylate oligomer typically comprises from about 0.1% by weight to about 10% by weight of the composition (preferably, from about 0.5% by weight to about 5% by weight of the composition).

Photoacid Generator

Photoacid generators are cationic photoinitiators. The hardcoat compositions used in the present invention comprise a photoacid generator to cationically polymerize the composition using ultraviolet (UV) light. Useful cationic photoinitiators include diaryliodonium salts, triarylsulfonium salts benzylsulfonium salts, phenacylsulfonium salts, N-benzylpyridinium salts, N-benzylpyrazinium salts, N-benzylammonium salts, phosphonium salts, hydrazinium salts, and ammonium borate salts.

Useful cationic initiators for the purposes of this invention also include the aromatic onium salts, including salts of Group Va elements, such as phosphonium salts, for example, triphenyl phenacylphosphonium hexafluorophosphate, salts of Group VIa elements, such as sulfonium salts, for example, triphenylsulfonium tetrafluoroborate, triphenylsulfonium hexafluorophosphate and triphenylsulfonium hexafluoroantimonate, and salts of Group VIIa elements, such as iodonium salts such as diphenyliodonium chloride and diaryl iodonium hexafluoroantimonate, the latter being preferred. The aromatic onium salts and their use as cationic initiators in the polymerization of epoxy compounds are described in detail in U.S. Pat. No. 4,058,401, "Photocurable Compositions Containing Group VIA Aromatic Onium Salts," by J. V. Crivello issued Nov. 15, 1977; U.S. Pat. No. 4,069,055, "Photocurable Epoxy Compositions Containing Group VA Onium Salts," by J. V. Crivello issued Jan. 17, 1978, U.S. Pat. No. 4,101,513, "Catalyst For Condensation Of Hydrolyzable Silanes And Storage Stable Compositions Thereof," by F. J. Fox et al. issued Jul. 18, 1978; and U.S. Pat. No. 4,161,478, "Photoinitiators," by J. V. Crivello issued Jul. 17, 1979, the disclosures of which are incorporated herein by reference.

Other cationic initiators can also be used in addition to those referred to above; for example, the phenyldiazonium hexafluorophosphates containing alkoxy or benzyloxy radicals as substituents on the phenyl radical as described in U.S. Pat. No. 4,000,115, "Photopolymerization Of Epoxides," by Sanford S. Jacobs issued Dec. 28, 1976, the disclosure of which is incorporated herein by reference. Preferred cationic initiators for use in the compositions of this invention are the salts of Group VIa elements and especially the sulfonium salts, and also the Group VIIa elements, particularly the diaryl iodonium hexafluororantimonates. Particular cationic catalysts include diphenyl iodonium salts of tetrafluoro borate, hexafluoro phosphate, hexafluoro arsenate, and hexafluoro antimonate; and triphenyl sulfonium salts of tetrafluoroborate, hexafluoro phosphate, hexafluoro arsenate, and hexafluoro antimonate.

Cyracure™ UVI-6976 (a mixture of triarylsulfonium hexafluoroantimonate salts in propylene carbonate) and UVI-6992 are examples of cationic photoinitiators available from Dow Chemical. Darocur™ 1173 cationic photoinitiator can be obtained from Ciba Geigy Co.

Cationic initiator is typically present in the compositions of the invention in a range from about 1% to about 5% by weight.

Optional Components

The hardcoat compositions can further comprise one or more diepoxide compounds. Diepoxide compounds can, for example, accelerate polymerization of the composition. They can also be used to adjust the softness or to reduce brittleness of the cured composition.

Suitable diepoxide comonomers include those disclosed in U.S. Pat. No. 4,293,606 (Zollinger et al.) of the formula:

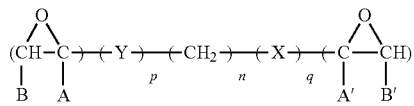

wherein n=1 to 6, X and Y independently represent (1) —O—(CH$_2$)$_m$—, wherein m=1 or 2 and the terminal carbon atom of this group is directly connected to the carbon of the epoxy group, or (2)

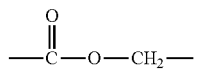

with the bond from the carbonyl carbon atom directly connected to the bridging group —(CH$_2$)$_n$—, p+q=1 or 2 and p and q are independently 0 or 1, A and B, and A' and B' are independently H or, when fused together as A and B or A' and B', the atoms necessary to form a 5- or 6-membered cycloaliphatic ring, and

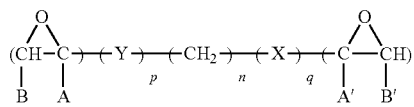

wherein A and B and A' and B' are as defined above r and u are independently integers of 1 to 6, and s is an integer of 1 to 6.

Preferably, the diepoxide comonomer is a cycloaliphatic diepoxide compound. A preferred diepoxide compound is 3,4-epoxycyclohexylmethyl-3,4-epoxycyclohexanecarboxylate.

If used, diepoxide comonomers are typically present in the compositions of the invention in amounts of less than about 40% by weight.

The hardcoat compositions of the invention may also comprise other optional components such as, for example, curable mono- and/or di-silanes (for example, to adjust hardness), surfactant, matting agents, inorganic particles, and the like.

In another aspect, the protective coating compositions may also comprise a fluorinated compound disclosed herein and a crosslinkable compound (for example, for coating hardness adjustment) represented by formula:

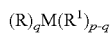

wherein

R is selected from the group consisting of alkyl, aryl, arylalkylenyl, and alkylarylenyl;

M is selected from the group consisting of Si, Ti, Zr, and Al (preferably, M is Si), R$^1$ is hydrolysable group selected from the group consisting of halide, hydroxyl, alkoxy, aryloxy, acyloxy, and polyalkyleneoxy;

p is 3 or 4; and q is 0, 1, or 2.

Representative compounds of this formula include tetramethoxysilane, tetraethoxysilane, methyltriethoxysilane, dimethyldiethoxysilane, octadecyltriethoxysilane, methyltrichlorosilane, tetramethyl orthotitanate, tetraethyl orthotitanate, tetraisopropyl orthotitanate, tetraethylzirconate, tetraisopropylzirconate, and tetrapropylzirconate.

If used, the crosslinkable silanes are typically present in the compositions of the invention in amounts of less than about 40% by weight.

The protective coating compositions may comprise a fluorinated additive disclosed herein and one or more crosslinkable multi-epoxides as well as one or more crosslinkable silanes.

Preferably, the coating compositions of the invention are solvent-free. In some embodiments, however, the coating compositions comprise solvent such as, for example, ketones (for example, acetone or methyl isobutyl ketone (MIBK)), esters (for example, ethyl acetate), or ethers (for example, methyl tert-butyl ether (MTBE) or tetrahydrofuran (THF)), or combinations.

Method and Articles

The hardcoat compositions of the invention can be used to provide durability, clarity, stain- and soil-resistance, water- and soil-repellency, easy-cleaning, and/or release properties to a hard substrate such as, for example, a substrate comprising natural stone, man-made stone, ceramic, vinyl, wood, masonry, cork, glass, or the like. The hardcoat composition can be applied using coating techniques known in the art, and then cured (that is, cationically polymerized) using ultraviolet light. Typically, when the protective coating is used on a hard substrate, the protective layer will be between about 0.1 mils and about 2 mils thick, but suitable thicknesses will depend upon the application.

The hardcoat compositions described above are particularly useful for forming a protective layer on phototools to provide scratch- and abrasion-resistance, as well as release properties. Phototools are typically made using a computer-aided design (CAD) system to prepare data for an exposure apparatus (for example, a photo-plotter) based on a target blueprint or data. Then, this data is used to perform direct writing of a designed pattern (for example, a circuit pattern) onto an emulsion photographic dry plate, which has been prepared by forming a film surface of a photosensitive emulsion layer on an optically clear substrate (for example, a glass substrate, fused silica or polyethylene terephthalate (PET), polycarbonate, or poly(methyl)methacrylate substrate). Optically clear substrates typically have low haze (for example, less than about 5% or even less than about 2%) and are substantially transparent (that is, they typically allow the passage of 95% or more (preferably 98% or more) of visible and ultraviolet light. The photographic dry plate with the pattern thereon is then developed, fixed, washed in water, and dried. It may then be examined for defects and, if necessary, retouched.

The photosensitive emulsion layer typically comprises a silver halide emulsion or a diazo emulsion. Thus, the film surface is relatively soft and easily scratched or marked. Chrome metal absorbing film may also be used.

The hardcoat compositions of the invention can be coated on the substrate of the phototool by any useful coating technique known in the art. The hardcoat composition can then be cured on the phototool using UV light to form the protective layer. Typically, the protective layer comprising the cured hardcoat composition will be from about 0.5 microns to about 40 microns thick; preferably, from about 2 microns to about 15 microns thick; more preferably, from about 2 microns to about 10 microns thick.

EXAMPLES

Objects and advantages of this invention are further illustrated by the following examples, but the particular materials and amounts thereof recited in these examples, as well as other conditions and details, should not be construed to unduly limit this invention.

Contact Angle Measurement

The coatings were rinsed for 1 minute by hand agitation in IPA before being subjected to measurement of water and hexadecane contact angles. Measurements were made using as-received reagent-grade hexadecane (Aldrich) and deionized water filtered through a filtration system obtained from Millipore Corporation (Billerica, Mass.), on a video contact angle analyzer available as product number VCA-2500XE from AST Products (Billerica, Mass.). Reported values are the averages of measurements on at least three drops measured on the right and the left sides of the drops. Drop volumes were 5 µL for static measurements and 1-3 µL for advancing and receding. For hexadecane, only advancing and receding contact angles are reported because static and advancing values were found to be nearly equal.

Marker Repellent Test

KING SIZE Permanent Marker, Sharpie Permanent Marker and Vis-à-vis Permanent Overhead Project Pen (all from SANFORD) were used for marker test and rated from 5 (completely bead-up) to 1 (no bead-up) in the order.

Solvent Resistant Test

On the coated and cured film, a big drop of MEK or other organic solvent was dropped in ~0.5 inch diameter. The appearance and change was visually rated and recorded after the solvent was allowed to evaporate at room temperature as, H for Hazy and C for Clear (no change of the coating). Then, a Sharpie permanent marker test was conducted over the dried MEK spot and rated as above (1 to 5). Reported values are the averages of three time ratings.

Steel Wool Durability Test

The abrasion resistance of the cured films was tested crossweb to the coating direction by use of a mechanical device capable of oscillating steel wool fastened to a stylus (by means of a rubber gasket) across the film's surface. The stylus oscillated over a 10 cm wide sweep width at a rate of 3.5 wipes/second wherein a "wipe" is defined as a single travel of 10 cm. The stylus had a flat, cylindrical geometry with a diameter of 3.8 mm having a 400 g load. The device was equipped with a platform on which weights were placed to increase the force exerted by the stylus normal to the film's surface. The steel wool was obtained from Rhodes-American a division of Homax Products, Bellingham, Wash. under the trade designation "#0000-Super-Fine" and was used as received. A single sample was tested for each sample, with the weight in grams applied to the stylus and the number of 50 wipes employed during testing reported in the tables. After scratch, Sharpie repellent was tested and contact angles were measured to determine the durability.

Cleaning Tissue Durability Test

Sight Savers pre-moisture lens cleaning tissue made from Bausch&Lomb were used for durability test, which contains IPA. After cleaning the surface of hardcoat for 20 times, Sharpie marker is re-tested and rated from 1 to 5 as before.

Materials:

HFPO—C(O)N(H)CH$_2$CH$_2$OC(O)CMe=CH$_2$ (HFPO-MAr, average molecular weight 1344) was prepared by a procedure similar to that described in U.S. Publication No. 2004-0077775, entitled "Fluorochemical Composition Comprising a Fluorinated Polymer and Treatment of a Fibrous Substrate Therewith," filed on May 24, 2002, for Synthesis of (HFPO)$_x$-methacrylate.

HFPO—C(O)N(H)CH$_2$CH$_2$OH(HFPO—OH or HFPO) was prepared by a procedure similar to that described in U.S. Publication No. 2004-0077775, entitled "Fluorochemical Composition Comprising a Fluorinated Polymer and Treatment of a Fibrous Substrate Therewith," filed on May 24, 2002, for Synthesis of HFPO-oligomer alcohols use.

A-186, Beta-(3,4-epoxycyclohexyl)ethyltrimethoxysilane), available from GE Advanced Materials;

A-187, Gamma-Glycidoxypropyltrimethoxysilane, available from GE Advanced Materials;

GMA, Glycidyl methacrylate (CAS#106-91-2, 97%), Aldrich;

GDGE, Glycerol diglycidyl ether (CAS#27043-36-3), Aldrich;

PI, photo-initiator, Cyracure UVI-6974, triarylsulphonium hexafluoroantimonate, 50% in propylene carbonate, available from Union Carbide Company;

GPTE, Glycerol Propoxylate Triglycidyl Ether, obtained from Sigma-Aldrich of Milwaukee, Wis.

Polyisocyanate Desmodur™ (Des) N100 and N3300 were obtained from Bayer Polymers LLC, of Pittsburgh, Pa.

TEOS, Tetraethyl orthosilicate, $Si(OC_2H_5)_4$, available from Sigma-Aldrich.

Di-Epoxy, 1,4-Cyclohexanedimethanol diglycidyl ether (CAS#14228-73-0), Aldrich;

ERL-4299, Bis-(3,4-epoxycyclohexylmethyl) adipate, available from Dow Chemical Company;

A-160, $HS(CH_2)_3Si(OMe)_3$, available from Silquest.

Chain transfer agent, $CBr_4$ and $C_{12}H_{25}SH$, obtained from Aldrich.

Epoxy-Silane Formulations:
ES-1, A-187/ER-4299/PI at the ratio of 89/2/9 by weight;
ES-2, A-186/GPTE/PI at the ratio of 86/5/9 by weight;
ES-3, 3M Scotchgard Film Protector II Epoxy Functionalized Perfluoropolyether Acrylate Oligomers as Additive in Epoxy-Silane Hardcoat 1. Preparation of Epoxy Functionalized Perfluoropolyether Acrylate Oligomers:

Preparation of HFPO-MAr/GMAr in the presence of $CBr_4$ chain transfer agent

FA-1, HFPO-MAr/GMAr/$CBr_4$ in 10/90/0.26 ratio by weight:

To a 4 Oz bottle with a magnetic stir bar, 1.0 g of HFPO-MAr (MW~1344, 0.744 mmol), 9.0 g GMAr (MW=142.16, 63.3 mmol), 0.26 g $CBr_4$ (MW=331.63, 0.078 mmol), 30 g EtOAc and 0.27 g Vazo-67 were charged. The solution was oligomerized at 70° C. for 24 hours after nitrogen bubbling. A clear homogeneous solution was obtained. From FTIR analysis, almost no $CH_2=CMe$— signal was observed.

FA-2, HFPO-MAr/GMAr/$CBr_4$ in 20/80/0.25 ratio by weight:

Similarly, FA-2 was prepared from 2.0 g of HFPO-MAr (MW~1344, 1.48 mmol), 8.0 g GMAr (MW=142.16, 56.27 mmol), 0.025 g $CBr_4$ (MW=331.63, 0.075 mmol), 30 g EtOAc and 0.17 g Vazo-67 by oligomerization at 70° C. for 24 hours. A clear homogeneous solution was obtained. From FTIR analysis, almost no $CH_2=CMe$— signal was observed.

FA-3, HFPO-MAr/GMAr/$CBr_4$ in 30/70/0.27 ratio by weight:

Similarly, FA-3 was prepared from 3.0 g of HFPO-MAr (MW~1344, 2.23 mmol), 7.0 g GMAr (MW=142.16, 49.24 mmol), 0.027 g $CBr_4$ (MW=331.63, 0.081 mmol), 30 g EtOAc and 0.28 g Vazo-67 by oligomerization at 70° C. for 24 hours. A clear homogeneous solution was obtained. From FTIR analysis, almost no $CH_2=CMe$— signal was observed.

FA-4, HFPO-MAr/A-174/$CBr_4$ in 40/60/0.35 ratio by weight:

Similarly, FA-4 was prepared from 4.0 g of HFPO-MAr (MW~1344, 2.976 mmol), 6.0 g GMAr (MW=142.16, 42.21 mmol), 0.035 g $CBr_4$ (MW=331.63, 0.1055 mmol), 40 g EtOAc and 0.244 g Vazo-67 by oligomerization at 70° C. for 24 hours. The solution was oligomerized at 70° C. for 24 hours after nitrogen bubbling. A clear homogeneous solution was obtained. From FTIR analysis, almost no $CH_2=CMe$— signal was observed.

With higher ratio of HFPO-MAr, the polymerization with GMAr in the presence of $CBr_4$ at 25% EtOAc solution resulted in two separated phases as summarized below.

| HFPO-MAr/GMAr/CBr4 | Product solution |
|---|---|
| 50/50/0.5 | Two Separated phases |
| 70/30/0.5 | Two Separated phases |

It was that, the polymerization of 50% or more HFPO-MAr with GMAr gives homogenous polymer solution in the presence of fluorinated solvent or fluorinated co-solvent.

Preparation of HFPO-MAr/GMAr in the Presence of RSH Chain Transfer Agent

FA-5, HFPO-MAr/GMAr/$C_{12}H_{25}SH$ in 30/70/3 ratio by weight:

To a 4 Oz bottle with a magnetic stir bar, 3.0 g of HFPO-MAr (MW~1344, 2.23 mmol), 7.0 g GMAr (MW=142.16, 49.24 mmol), 0.3 g $C_{12}H_{25}SH$ (MW=202.40, 1.48 mmol), 30 g MEK and 0.35 g Vazo-67 were charged. The solution was oligomerized at 70° C. for 24 hours after nitrogen bubbling. A clear homogeneous solution was obtained. From FTIR analysis, almost no $CH_2=CMe$— signal was observed.

FA-6, HFPO-MAr/GMAr/A-160 in 30/70/3 ratio by weight:

To a 4 Oz bottle with a magnetic stir bar, 3.0 g of HFPO-MAr (MW~1344, 2.23 mmol), 7.0 g GMAr (MW=142.16, 49.24 mmol), 0.30 g A-160 (MW=196, 1.53 mmol), 30 g MEK and 0.38 g Vazo-67 were charged. The solution was oligomerized at 70° C. for 24 hours after nitrogen bubbling. A slightly cloudy solution was obtained. From FTIR analysis, almost no $CH_2=CMe$— signal was observed.

2. Results and Discussion:

All formulations were coated on primed PET with No#6 wire rod, and cured with different UV sources as identified below for 2 minutes unless specifically noted. Generally, all formulations were clear solution (unless noted)

UV-1: H-Bulb under $N_2$, two pass at 25 feet per minute;

UV-2: Two Sylvania Germicidal G15T8 (15W) bulbs in the air;

UV-3: Two Black Light Blue UV (F15T8BLB15W) bulbs in the air.

1. Epoxy-Silane Hardcoat with Epoxy-Perfluoropolyether Acrylate Oligomers Additives:

A series of epoxy functionalized perfluoropolyether acrylate oligomers were blended with epoxy-silane (ES) formulations at different levels (0.5~5% by weight), with or without extra solvent, and cured under different UV source in the air. The representative examples of coating quality, marker repellent and contact angle have been summarized in Table 1.

TABLE 1

| Exp. No# | Formulation | Coating Quality | Marker Repellent** | H₂O Adv/Rec/Static | | | HD Adv/Rec/Static | | |
|---|---|---|---|---|---|---|---|---|---|
| C-1 | ES-1/F-additive 100/0 UV-2 | Excellent | 1/1/1 | 87 | 38 | 85 | 21 | 12 | 19 |
|  |  |  |  | 85 | 38 | 83 | 21 | 11 | 19 |
|  |  |  |  | 85 | 38 | 82 |  |  |  |
| Average |  |  |  | 86 | 38 | 83 | 21 | 12 | 19 |
| C-2 | ES-2/F-additive 100/0 UV-2 | Good | 1/1/1 | 77 | 44 | 68 | 12 | 4 | 10 |
|  |  |  |  | 78 | 45 | 67 | 12 | 5 | 11 |
| Average |  |  |  | 78 | 45 | 68 | 12 | 5 | 11 |
| C-3 | ES-3/F-additive 100/0 UV-2 | Good | 4/3/3 | 91 | 55 | 91 | 32 | 26 | 32 |
|  |  |  |  | 91 | 55 | 91 | 32 | 27 | 34 |
| Average |  |  |  | 91 | 55 | 91 | 32 | 27 | 33 |
| C-4** | Release Liner | N/A | 2/3/3 | 95 | 62 | 93 | 34 | 19 | 34 |
|  |  |  |  | 92 | 59 | 90 | 34 | 18 | 33 |
| Average |  |  |  | 94 | 61 | 92 | 34 | 19 | 34 |
| 1 | ES-1/FA-1 99.5/0.5 UV-2 | Excellent | 5/5/5 | 96 | 56 | 96 | 60 | 43 | 57 |
|  |  |  |  | 99 | 53 | 95 | 59 | 42 | 56 |
|  |  |  |  | 97 | 56 | 96 |  |  |  |
| Average |  |  |  | 97 | 55 | 96 | 60 | 43 | 57 |
| 2 | ES-1/FA-1 99/1 UV-2 | Excellent | 5/3/5 | 103 | 59 | 102 | 56 | 46 | 60 |
|  |  |  |  | 104 | 57 | 102 | 58 | 44 | 60 |
| Average |  |  |  | 104 | 58 | 102 | 57 | 45 | 60 |
| 3 | ES-1/FA-1 98/2 UV-2 | Excellent | 2/2/2 | 112 | 69 | 109 | 71 | 61 | 69 |
|  |  |  |  | 112 | 68 | 110 | 72 | 61 | 70 |
| Average |  |  |  | 112 | 69 | 110 | 72 | 61 | 70 |
| 4 | ES-1/FA-1 95/5 UV-2 | Excellent | 5/5/5 | 107 | 66 | 105 | 70 | 54 | 69 |
|  |  |  |  | 110 | 68 | 107 | 68 | 54 | 67 |
|  |  |  |  | 110 | 66 | 106 |  |  |  |
| Average |  |  |  | 109 | 67 | 106 | 69 | 54 | 68 |
| 5 | ES-2/FA-1 95/5 UV-2 | Fair | 5/5/5 | 113 | 73 | 109 | 70 | 60 | 68 |
|  |  |  |  | 114 | 73 | 110 | 70 | 61 | 69 |
| Average |  |  |  | 114 | 73 | 110 | 70 | 61 | 69 |
| 6 | ES-1/FA-2 99.5/0.5 UV-2 | Excellent | 5/5/5 | 107 | 72 | 106 | 71 | 60 | 70 |
|  |  |  |  | 107 | 74 | 107 | 69 | 58 | 68 |
| Average |  |  |  | 107 | 73 | 107 | 70 | 59 | 69 |
| 7 | ES-1/FA-2 98/2, 50% in MEK UV-2 | Good | 2/2/3 | 113 | 77 | 110 | 70 | 63 | 68 |
|  |  |  |  | 111 | 76 | 107 | 71 | 63 | 69 |
|  |  |  |  | 112 | 77 | 109 |  |  |  |
| Average |  |  |  | 112 | 77 | 109 | 71 | 63 | 69 |
| 8 | ES-2/FA-2 99.5/0.5 UV-2 | Excellent | 5/5/5 | 101 | 61 | 100 | 67 | 52 | 64 |
|  |  |  |  | 102 | 62 | 100 | 66 | 51 | 63 |
| Average |  |  |  | 102 | 62 | 100 | 67 | 52 | 64 |
| 9 | ES-2/FA-2 98/2 UV-2 | Excellent | 5/5/5 | 108 | 67 | 106 | 72 | 61 | 67 |
|  |  |  |  | 109 | 68 | 107 | 72 | 61 | 68 |
| Average |  |  |  | 109 | 68 | 107 | 72 | 61 | 68 |
| 10 | ES-1/FA-3 98/2, 50% in MEK UV-2 | Excellent | 2/2/5 | 113 | 74 | 109 | 72 | 65 | 70 |
|  |  |  |  | 114 | 76 | 110 | 71 | 63 | 69 |
| Average |  |  |  | 114 | 75 | 110 | 72 | 64 | 70 |
| 11 | ES-2/FA-3 98/2 UV-2 | Excellent | 5/5/5 | 116 | 75 | 110 | 71 | 61 | 68 |
|  |  |  |  | 112 | 75 | 110 | 72 | 63 | 69 |
|  |  |  |  | 115 | 75 | 110 |  |  |  |
| Average |  |  |  | 114 | 75 | 110 | 72 | 62 | 69 |
| 12 | ES-1/FA-4 99.5/0.5 UV-2 | Excellent | 5/5/5 | 105 | 70 | 103 | 67 | 52 | 65 |
|  |  |  |  | 105 | 69 | 103 | 66 | 51 | 65 |
| Average |  |  |  | 105 | 70 | 103 | 67 | 52 | 65 |
| 13 | ES-1/FA-4 98/2, 50% in MEK UV-2 | Excellent | 3/2/5 | 116 | 70 | 111 | 73 | 68 | 71 |
|  |  |  |  | 118 | 71 | 111 | 72 | 67 | 70 |
| Average |  |  |  | 117 | 71 | 111 | 73 | 68 | 71 |
| 14 | ES-1/FA-5 99/1 UV-2 | Excellent | 5/5/5 | 117 | 75 | 112 | 70 | 59 | 69 |
|  |  |  |  | 115 | 74 | 113 | 69 | 57 | 69 |
| Average |  |  |  | 116 | 75 | 113 | 70 | 58 | 69 |
| 15 | ES-2/FA-5 99/1 UV-2 | Good | 5/5/4 | 105 | 65 | 104 | 67 | 53 | 66 |
|  |  |  |  | 104 | 66 | 102 | 67 | 53 | 65 |
| Average |  |  |  | 105 | 66 | 103 | 67 | 53 | 66 |
| 16 | ES-1/FA-6 98/2 UV-3 | Excellent | 5/5/5 | 116 | 74 | 108 | 70 | 63 | 69 |
|  |  |  |  | 115 | 75 | 110 | 71 | 62 | 68 |
| Average |  |  |  | 114 | 78 | 109 | 71 | 61 | 68 |
| 17 | ES-1/FA-6 95/5 UV-3 | Excellent | 5/5/5 | 113 | 79 | 109 | 70 | 63 | 68 |
|  |  |  |  | 113 | 78 | 109 | 70 | 62 | 69 |
| Average |  |  |  | 113 | 79 | 109 | 70 | 63 | 69 |
| 18 | ES-3/FA-6 98/2 | Good | 5/5/5 | 115 | 70 | 111 | 72 | 67 | 70 |
|  |  |  |  | 116 | 71 | 111 | 71 | 66 | 70 |
| Average |  |  |  | 116 | 71 | 111 | 72 | 67 | 70 |
| 19 | ES-3/FA-6 95/5 | Good | 5/5/5 | 115 | 64 | 109 | 72 | 66 | 70 |
|  |  |  |  | 116 | 62 | 109 | 73 | 67 | 71 |
|  |  |  |  | 116 | 63 | 109 | 73 | 67 | 71 |

*The order of markers tested: King/Sharpie/Vis-à-vis;
**Used for laminating on ES-3 hardcoat for release performance made by Sekisui Chemical from Japan.

2. Epoxy Functionalized Perfluoropolyether Acrylate Oligomers Containing Epoxy-Silane Hardcoat with Extra Crosslinkers:

Table 2 summarizes examples of epoxy-silane hardcoat with extra crosslinkers in addition to epoxy functionalized perfluoropolyether acrylate oligomers.

TABLE 2

| Exp. No# | Formulation | $H_2O$ Adv/Rec/Static | | | HD Adv/Rec/Static | | | Marker Repellent* | Coating Quality |
|---|---|---|---|---|---|---|---|---|---|
| 20 | ES-1/FA-4/DiEpoxide 93/2/5 | 114 | 62 | 110 | 72 | 67 | 70 | 4/4/5 | Good |
|  |  | 114 | 64 | 109 | 73 | 68 | 71 |  |  |
| Average | 50% MEK, UV-2 | 114 | 63 | 110 | 73 | 68 | 71 |  |  |
| 21 | ES-1/FA-3/DiEpoxide 93/2/5 | 115 | 65 | 111 | 71 | 63 | 68 | 4/4/5 | Good |
|  |  | 114 | 66 | 109 | 72 | 63 | 69 |  |  |
| Average | 50% MEK, UV-2 | 115 | 66 | 110 | 72 | 63 | 69 |  |  |
| 22 | ES-1/FA-4/TEOS 93/2/5 | 114 | 72 | 110 | 72 | 65 | 69 | 5/4/5 | Good |
|  |  | 114 | 70 | 109 | 71 | 65 | 69 |  |  |
| Average | 50% MEK, UV-2 | 114 | 71 | 110 | 72 | 65 | 69 |  |  |
| 23 | ES-1/FA-3/TEOS 93/2/5 | 114 | 69 | 109 | 71 | 64 | 69 | 3/4/5 | Excellent |
|  |  | 114 | 68 | 110 | 72 | 64 | 70 | 5/5/5** |  |
| Average | 50% MEK, UV-2 | 114 | 69 | 110 | 72 | 64 | 70 |  |  |
| 24 | ES-2/FA-3/DiEpoxide 93/2/5 | 115 | 78 | 111 | 71 | 63 | 68 | 5/5/5 | Good |
|  |  | 113 | 80 | 111 | 72 | 62 | 69 |  |  |
| Average | UV-2 | 114 | 79 | 111 | 72 | 63 | 69 |  |  |
| 25 | ES-2/FA-4/TEOS 93/2/5 | 112 | 76 | 110 | 72 | 65 | 70 | 5/5/5 | Good |
|  |  | 114 | 74 | 110 | 72 | 65 | 69 |  |  |
| Average | UV-2 | 113 | 75 | 110 | 72 | 65 | 70 |  |  |

*Marker order: King/Sharpie/VisaVis;
**Remeasured marker repellent after 12 hours.

3. Solvent Resistant Test Results

Solvent resistant test from coating films were studied, and the results to Sharpie are summarized in Table 3.

TABLE 3

| Exp. No# | Tissue Test (20 times Scratch) | Solvent | | | | | |
|---|---|---|---|---|---|---|---|
|  |  | EtOAc | IPA | Acetone | Toluene | MEK | DMF |
| 1 | C/5 | C/5 | C/5 | C/5 | C/5 | C/5 | C/5 |
| 2 | C/5 | C/5 | C/5 | C/5 | C/5 | C/5 | C/5 |
| 3 | C/5 | C/5 | C/5 | C/5 | C/5 | C/5 | C/5 |
| 4 | C/5 | C/5 | C/5 | C/5 | C/5 | C/5 | C/5 |
| 5 | C/5 | C/5 | C/5 | C/5 | C/5 | C/5 | C/5 |
| 6 | C/5 | C/5 | C/5 | C/5 | C/5 | C/5 | C/5 |
| 7 | C/5 | C/5 | C/5 | C/5 | C/5 | C/5 | C/5 |
| 11 | C/5 | C/5 | C/5 | C/5 | C/5 | C/5 | C/5 |
| 12 | C/5 | C/5 | C/5 | C/5 | C/5 | C/5 | C/5 |
| 13 | C/5 | C/5 | C/5 | C/5 | C/5 | C/5 | C/5 |
| 14 | C/5 | C/5 | C/5 | C/5 | C/5 | C/5 | C/5 |
| 15 | C/5 | C/5 | C/5 | C/5 | C/5 | C/5 | C/5 |
| 16 | C/5 | C/5 | C/5 | C/5 | C/5 | C/5 | C/5 |

The results from Table 3 indicate excellent solvent resistance.

4. Steel Wood Durability Test Results (50 times rubs at 400 g weight):

Steel wood durability test on coated films was studied and the results after 50 time rubs with 400 g weight are summarized in Table 4.

TABLE 4

| Exp. NO# | Visible Scratches | Marker Respellent** | $H_2O$ Adv/Rec/Static | | | HD Adv/Rec/Static | | |
|---|---|---|---|---|---|---|---|---|
| 2 | No | 5/5/5 | 114 | 78 | 109 | 70 | 63 | 69 |
|  |  |  | 111 | 76 | 108 | 71 | 64 | 69 |
|  |  |  | 113 | 79 | 110 |  |  |  |
| Average 3 | No | 5/5/5 | 113 | 78 | 109 | 71 | 64 | 69 |
|  |  |  | 114 | 64 | 108 | 65 | 50 | 63 |
|  |  |  | 112 | 63 | 107 | 66 | 50 | 64 |
| Average 8 | No | 5/5/5 | 113 | 64 | 108 | 66 | 50 | 64 |
|  |  |  | 111 | 68 | 106 | 66 | 52 | 64 |
|  |  |  | 110 | 67 | 105 | 67 | 51 | 66 |
| Average 9 | No | 5/5/5 | 111 | 68 | 106 | 67 | 52 | 65 |
|  |  |  | 115 | 82 | 109 | 73 | 63 | 69 |
|  |  |  | 115 | 80 | 109 | 71 | 60 | 67 |
|  |  |  |  |  |  | 70 | 59 | 66 |
| Average C-4** | Scratched | Not Tested | 115 | 81 | 109 | 71 | 61 | 67 |
|  |  |  | Not measured | | | Not measured | | |

*King/Sharpie/Vis-à-vis;
**Release Liner for laminating on ES-3 hardcoat; Tested only 4 time rubs at 200 g weight.

5. Peel Release Testing and Ink Release Testing:

Unless otherwise noted, all parts, percentages, ratios, etc. in the examples and the rest of the specification are by weight, and all reagents used in the examples were obtained, or are available, from general chemical suppliers such as, for example, Sigma-Aldrich Company, Saint Louis, Mo., or may be synthesized by conventional methods.

Samples were prepared for release testing by attaching 3-layer laminates of backing/releasable hardcoat/tape to a 17.8 centimeter by 33 centimeter steel panel using double-coated adhesive tape (commercially available from 3M Company under the trade designation "410B") via the backing side of the construction using a 2.3 kg rubber roller. The tape was then peeled from the RHC at 180° at a rate of 2.3 meters/minute (90 inches/minute). All tests were done in a facility at constant temperature (70° C.) and constant humidity (50% RH). The peel tester used for all examples was an IMass model SP2000 peel tester obtained from IMASS, Inc., Accord, Mass. Measurements were obtained in grams/inch.

A release film was prepared by coating a solution of CP-1 (0.2% solids by weight diluted with MEK) on PET film-1 using a No. 6 Mayer rod, and then drying the coated film for 2 minutes at 150° C. Adhesive 1 was wet cast onto this release film by spreading the adhesive onto the release film using a notch bar coater 15 centimeters wide (6 inches) with a 356 micrometer (14 mil) wet gap. This adhesive coated release film was attached to a fiberboard frame and dried for 10 minutes at 70° C. The adhesive/release film system was then laminated to PET film-3. The laminate was then subjected to the Release Test. Table 5 summarizes peel release results with FA-4 as additive in ES-1 at different levels.

TABLE 5

| Exp. No# | Formulation ES-1/FA-6 | Tested Tape Type | Average Peel Force (g/in) |
|---|---|---|---|
| C-1 | 100/0 | 845 | 2340 |
| 29 | 99.5/0.5 | 845 | 500 |
| 30 | 98/2 | 845 | 425 |
| 31 | 95/5 | 845 | 402 |
| C-1 | 100/0 | 610 | 1460 |
| 32 | 99.5/0.5 | 610 | 950 |
| 33 | 98/2 | 610 | 510 |
| 34 | 95/5 | 610 | 540 |

Release Test Results from Ink:

Below in Table 6 are the results of a single solder mask ink transfer test. The ink is available from Taiyo Ink Mfg. Co., Ltd., Japan (PSR-4000 AUS303/CA-40 AUS303). Scale went from 0 to 5 where 0 is no ink transfer, 5 is 100% ink transfer to the hardcoat and 2.5 would be approximately a 50% transfer. Examples are summarized in Table 6.

TABLE 6

| Exp. No# | ES-1/FA-6 | Ink Transfer Before UV Curing | Ink Transfer After UV Curing |
|---|---|---|---|
| C-1 | 100/0 | 5 | 5 |
| C-1 | 100/0 | 5 | 5 |
| 35 | 99.5/0.5 | 1 | 0 |
| 36 | 98/2 | 0 | 0 |
| 37 | 95/5 | 0 | 0 |

Protective Coating from Pure HFPO-Polyacrylate-Epoxide:

Pure HFPO-polyacrylate-epoxide as coating in the presence of photoacid generator was studied. Table 7 summarizes the examples of HFPO-polyacrylate-epoxide hardcoat on PET Film without epoxysilane.

TABLE 7

| Example | Formulation* | H$_2$O Adv/Rec/Static | | | HD Adv/Rec/Static | | | Marker Repellent** | Coating Quality |
|---|---|---|---|---|---|---|---|---|---|
| 38 | FA-4/PI | 118 | 69 | 113 | 74 | 63 | 71 | 5/5/5 | Fair |
| | 92/8 50% MEK | 121 | 73 | 115 | 74 | 62 | 71 | | |
| | UV-2 | 121 | 75 | 114 | | | | | |
| Average | | 120 | 72 | 114 | 74 | 63 | 71 | | |
| 39 | FA-3/PI | 118 | 79 | 112 | 72 | 67 | 70 | 5/5/5 | Good |
| | 92/8, UV-2 | 117 | 78 | 112 | 72 | 66 | 69 | | |
| Average | | 118 | 79 | 112 | 72 | 67 | 70 | | |
| 40 | FA-2/PI | 115 | 72 | 110 | 71 | 64 | 69 | 5/5/5 | Good |
| | 92/8, UV-2 | 116 | 74 | 111 | 71 | 63 | 69 | | |
| Average | | 116 | 73 | 111 | 71 | 64 | 69 | | |
| 40 | FA-1/PI | 110 | 66 | 107 | 70 | 58 | 68 | 5/5/5 | Good |
| | 92/8, UV-2 | 110 | 64 | 107 | 69 | 58 | 67 | | |
| Average | | 110 | 65 | 107 | 70 | 58 | 68 | | |
| 42 | FA-5/PI | 119 | 81 | 111 | 70 | 58 | 68 | 4/4/5 | Good |
| | 92/8, UV-2 | 120 | 81 | 110 | 71 | 59 | 68 | | |
| Average | | 120 | 81 | 111 | 71 | 59 | 68 | | |

*PI, UVI-6974; 42A, HFPO-MAr/Epoxy-MAr/CBr4 (40/60/0.30);
**King/Sharpie/VisaVis, 5 = best, 1 = worst performance Additional Examples on Different Substrates HFPO-polyacrylate-epoxide coating on different substrates was also studied and results are summarized in Table 8.

TABLE 8

| NB # | Formulation* | H$_2$O Adv/Rec/Static | | | HD Adv/Rec/Static | | | Marker Repellent** | Coating Quality | Substrate |
|---|---|---|---|---|---|---|---|---|---|---|
| 43 | A187/FA-3/DiEpoxide | 107 | 65 | 102 | 71 | 60 | 69 | 5/5/5 | Good | Aluminum |
| | 93/2/5 | 107 | 64 | 102 | 71 | 61 | 70 | | | |
| Average | UV-2; 50% MEK | 107 | 65 | 102 | 71 | 61 | 70 | | | |
| 44 | A187/FA-3/DiEpoxide | 81 | 60 | 60 | 63 | 55 | 58 | 5/5/5 | Good | Copper |
| | 93/2/5 | 80 | 61 | 70 | 62 | 55 | 59 | | | |
| | UV-2 | 80 | 60 | 71 | | | | | | |
| Average | 50% MEK | 80 | 60 | 67 | 63 | 55 | 59 | | | |
| 45 | A187/FA-3/TEOS | 112 | 77 | 108 | 72 | 64 | 69 | 5/5/5 | Good | PMMA |
| | 93/2/5 | 112 | 79 | 109 | 72 | 64 | 70 | | | |

TABLE 8-continued

| NB # | Formulation* | H₂O Adv/Rec/Static | | | HD Adv/Rec/Static | | | Marker Repellent** | Coating Quality | Substrate |
|---|---|---|---|---|---|---|---|---|---|---|
| | UV-2, 50% MEK | 112 | 78 | 109 | 72 | 64 | 70 | | | |
| Average 46 | A187/FA-4/TEOS 93/2/5 | 117 | 75 | 109 | 72 | 67 | 70 | 4/4/5 | Good | Ceramic |
| | | 115 | 76 | 110 | 72 | 67 | 70 | | | |
| Average | UV-2, 50% MEK | 116 | 76 | 110 | 72 | 67 | 70 | | | |

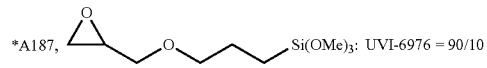
*A187, UVI-6976 = 90/10

**Marker order: King/Sharpie/VisaVis

The complete disclosures of the publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. A hardcoat composition comprising:
   (a) one or more epoxy silane compounds,
   (b) one or more epoxy-functionalized perfluoropolyether acrylate oligomers, having the following general structure:

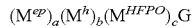
   $(M^{ep})_a(M^h)_b(M^{HFPO})_c G$ wherein:
   $M^{ep}$ is a radical from acrylate or methacrylate monomer with a curable epoxy group;
   $M^{HFPO}$ is a radical from perfluoropolyether-containing acrylate or methacrylate monomer;
   $M^h$ is a radical from one or more hydrocarbon acrylate monomers;
   G is a radical from a chain transfer agent;
   a is at least 1; b is 0 to 20; and c is at least 1, and
   (c) photo-acid generator.

2. The hardcoat composition of claim 1 wherein the epoxy silane compound is an epoxy-terminated silane compound.

3. The hardcoat composition of claim 2 wherein the epoxy silane compound is selected from the group consisting of γ-glycidoxypropyl trimethoxy silane, γ-glycidoxypropylmethyldiethoxysilane, and beta-(3,4-epoxycyclohexyl) ethyltrimethoxysilane.

4. The hardcoat composition of claim 1 wherein $M^{HFPO}$ is a radical from perfluoropolyether made from the oligomerization of hexafluoropropylene oxide.

5. The hardcoat composition of claim 1 wherein $M^{ep}$ is a radical from glycidyl methacrylate or glycidyl acrylate.

6. The hardcoat composition of claim 1 wherein $M^h$ is a radical from methyl acrylate, methyl methacrylate, ethyl acrylate, ethyl methacrylate, butyl acrylate, butyl methacrylate, octyl acrylate, octyl methacrylate, octadecyl acrylate, or octadecyl methacrylate.

7. The hardcoat composition of claim 1 further comprising one or more curable silane compounds.

8. The hardcoat composition of claim 7 wherein the curable silane compound has the following general structure:

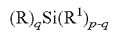
$(R)_q Si(R^1)_{p-q}$ wherein
R is selected from the group consisting of alkyl, aryl, arylalkylenyl, and alkylarylenyl;
$R^1$ is a hydrolysable group selected from the group consisting of halide, hydroxyl, alkoxy, aryloxy, acyloxy, and polyalkyleneoxy;
p is 3 or 4; and
q is 0,1,or 2.

9. The hardcoat composition of claim 1 further comprising one or more multi-epoxide compounds.

10. The hardcoat composition of claim 9 comprising one or more cycloaliphatic diepoxide compounds.

11. The hardcoat composition of claim 1 further comprising one or more curable silane compounds and one or more multi-epoxide compounds.

12. The hardcoat composition of claim 1 wherein the epoxy-functionalized perfluoropolyether acrylate oligomer has the following general structure:

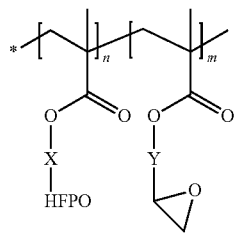

wherein
HFPO is perfluoropolyether made from the oligomerization of hexafluoropropene oxide having an average molecular weight of 1,000 or higher;
X and Y are independently divalent linkage groups;
n is at least 1, and m is at least 1.

13. The hardcoat composition of claim 1 wherein the epoxy-functionalized perfluoropolyether acrylate oligomer comprises from about 0.1% by weight to about 10% by weight of the hardcoat composition.

14. The hardcoat composition of claim 13 wherein the epoxy-functionalized perfluoropolyether acrylate oligomer comprises from about 0.5% by weight to about 5% by weight of the hardcoat composition.

15. The hardcoat composition of claim 1 wherein the photo-acid generator is a cationic photoinitiator.

16. A hardcoat composition comprising the reaction product of:
   (a) one or more epoxy silane compounds,
   (b) one or more epoxy-functionalized perfluoropolyether acrylate oligomers, having the following general structure:

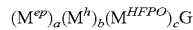
   $(M^{ep})_a(M^h)_b(M^{HFPO})_c G$ wherein:

$M^{ep}$ is a radical from acrylate or methacrylate monomer with a curable epoxy group;

$M^{HFPO}$ is a radical from perfluoropolyether-containing acrylate or methacrylate monomer;

$M^h$ is a radical from one or more hydrocarbon acrylate monomers;

G is a radical from chain transfer agent;

a is at least 1; b is 0 to 20; and c is at least 1, and (c) photo-acid generator.

17. A coated article comprising a substrate and a cured protective layer comprising the hardcoat composition of claim 16 in cured form on at least a portion of the substrate.

18. A phototool comprising an optically clear substrate having a designed pattern, and a cured protective layer comprising the hardcoat composition of claim 16 in cured form on the substrate.

19. The phototool of claim 18 wherein the substrate comprises a photosensitive emulsion layer.

20. The phototool of claim 18 wherein the protective layer is from about 0.5 microns to about 40 microns thick.

21. A method of making a printed circuit comprising placing the phototool of claim 18 on a photoresist layer, exposing the photoresist layer and phototool to high intensity light, and removing the phototool from the photoresist layer.

22. The method of claim 21 wherein the photoresist layer further comprises solder mask ink.

23. The method of claim 21 wherein the method is repeated 5 times or more.

24. A phototool comprising an optically clear substrate having a designed pattern, and a cured protective layer comprising a hardcoat composition in cured form on the substrate;

wherein the hardcoat composition comprises an epoxy-functionalized perfluoropolyether acrylate oligomer and a photo-acid generator, wherein the epoxy-functionalized perfluoropolyether acrylate oligomer comprises a reaction product of components comprising:

(i) one or more acrylate or methacrylate monomers with a curable epoxy group;

(ii) one or more perfluoropolyether-containing acrylate or methacrylate monomers; and (iii) a chain transfer agent;

wherein the epoxy-functionalized perfluoropolyether acrylate oligomer comprises no units derived from alkyl(meth)acrylate monomers.

\* \* \* \* \*

UNITED STATES PATENT AND TRADEMARK OFFICE
CERTIFICATE OF CORRECTION

Page 1 of 3

PATENT NO. : 8,663,874 B2
APPLICATION NO. : 12/922133
DATED : March 4, 2014
INVENTOR(S) : Zai-Ming Qiu et al.

It is certified that error appears in the above-identified patent and that said Letters Patent is hereby corrected as shown below:

On the Title Page

First Page, Column 2 Item (56) (Other Publications)
Line 2, Delete "(UVIEB)" and insert -- (UV/EB) --, therefor.

In the Specification

Column 4
Line 1, Delete "O-" and insert -- β- --, therefor.

Column 4
Line 6, Delete "α-" and insert -- δ- --, therefor.

Column 4
Line 7, Delete "α-" and insert -- δ- --, therefor.

Column 4
Line 7, Delete "α-" and insert -- δ- --, therefor.

Column 4
Line 8, Delete "α-" and insert -- δ- --, therefor.

Column 4
Line 11, Delete "α-" and insert -- δ- --, therefor.

Column 4
Line 11, Delete "α-" and insert -- δ- --, therefor.

Signed and Sealed this
Twenty-first Day of October, 2014

Michelle K. Lee
*Deputy Director of the United States Patent and Trademark Office*

CERTIFICATE OF CORRECTION (continued)

U.S. Pat. No. 8,663,874 B2

Column 4
Line 12, Delete "8-" and insert -- δ- --, therefor.

Column 4
Line 29 (Approx.), Delete "(3,4-epoxycyclohexyl) butyl" and insert -- (3,4-epoxycyclohexyl)butyl --, therefor.

Column 5
Line 30 (Approx.), Delete "—$CH_3$—" and insert -- —$CH_2$— --, therefor.

Column 5
Line 34 (Approx.), Delete "—$Si(OCH_3CH_2OH)_3$" and insert -- —$Si(OCH_2CH_2OH)_3$ --, therefor.

Column 5
Line 36 (Approx.), Delete "—$Si[O(CH_3CH_2O)_3CH_2]_3$" and insert -- —$Si[O(CH_2CH_2O)_3CH_3]_3$ --, therefor.

Column 5
Line 37 (Approx.), Delete "—$Si(OCH_2)_3$" and insert -- —$Si(OCH_3)_3$ --, therefor.

Column 5
Line 40 (Approx.), Delete "—O—$CH_3$" and insert -- —O—$CH_2$ --, therefor.

Column 5
Line 44 (Approx.), Delete "$CH_3)_4$" and insert -- $CH_2)_4$ --, therefor.

Column 6
Line 4 (Approx.), Delete "—$CH_3$—$CH_2$—" and insert -- —$CH_2$—$CH_2$— --, therefor.

Column 7
Line 64, Delete "hexyluoropropene" and insert -- hexafluoropropene --, therefor.

Column 8
Line 31, Delete "digylycidyl" and insert -- diglycidyl --, therefor.

Column 9
Line 11 (Approx.), Delete "cyclolhexyl-methanol" and insert -- cyclohexyl-methanol --, therefor.

Column 10
Line 58, Delete "$CF_3O(C_2F_4O)CF_2$—," and insert -- $CF_3O(C_2F_4O)_nCF_2$—, --, therefor.

Column 10
Line 58-59, Delete "$CF_2O$—$CF(CF_3)$—" and insert -- $CF_2O)_nCF(CF_3)$— --, therefor.

CERTIFICATE OF CORRECTION (continued)
U.S. Pat. No. 8,663,874 B2

Column 10
Line 62, Delete "(C$_2$F$_4$O)—CF$_2$—," and insert -- (C$_2$F$_4$O)$_n$CF$_2$—, --, therefor.

Column 10
Line 63, Delete "CF(CF$_3$)" and insert -- —CF(CF$_3$) --, therefor.

Column 10
Line 64, Delete "CF$_2$O)—CF(CF$_3$)—," and insert -- CF$_2$O)$_n$CF(CF$_3$)—, --, therefor.

Column 13
Line 49, Delete "hexafluororantimonates." and insert -- hexafluoroantimonate. --, therefor.

Column 13
Line 58, Delete "photoinitator" and insert -- photoinitiator --, therefor.

Column 17
Line 64, Delete "CH$_2$=CMe—" and insert -- CH$_2$=CMe— --, therefor.

In the Claims

Column 26
Line 18, In Claim 8, delete "R$^1$is" and insert -- R$^1$ is --, therefor.